(12) United States Patent
Ohkubo et al.

(10) Patent No.: US 7,579,673 B2
(45) Date of Patent: Aug. 25, 2009

(54) SEMICONDUCTOR DEVICE HAVING ELECTRICAL FUSE

(75) Inventors: Hiroaki Ohkubo, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/506,860

(22) Filed: Aug. 21, 2006

(65) Prior Publication Data
US 2007/0045783 A1 Mar. 1, 2007

(30) Foreign Application Priority Data
Aug. 24, 2005 (JP) ............................. 2005-243346

(51) Int. Cl.
*H01L 23/58* (2006.01)
(52) U.S. Cl. ...................... 257/665; 257/530
(58) Field of Classification Search .............. 257/529, 257/530, 665
See application file for complete search history.

(56) References Cited

U.S. PATENT DOCUMENTS

| | | | |
|---|---|---|---|
| 6,913,954 B2 * | 7/2005 | Kothandaraman | 438/132 |
| 6,989,577 B2 * | 1/2006 | Koike | 257/529 |
| 7,085,688 B1 * | 8/2006 | Sumida et al. | 703/2 |
| 7,282,751 B2 * | 10/2007 | Ueda | 257/209 |
| 2003/0052712 A1 * | 3/2003 | Comer | 326/38 |
| 2004/0066695 A1 * | 4/2004 | Anand et al. | 365/225.7 |
| 2004/0224444 A1 * | 11/2004 | Hisaka | 438/132 |
| 2005/0035890 A1 * | 2/2005 | Karasawa et al. | 341/144 |
| 2006/0103554 A1 * | 5/2006 | Jones | 341/50 |
| 2007/0045783 A1 * | 3/2007 | Ohkubo et al. | 257/665 |
| 2007/0063312 A1 * | 3/2007 | Takemoto | 257/529 |
| 2007/0201177 A1 * | 8/2007 | Kladar et al. | 361/118 |

FOREIGN PATENT DOCUMENTS

| | | |
|---|---|---|
| JP | 11-297837 | 10/1999 |
| JP | 2004-214580 | 7/2004 |
| JP | 2005-039220 | 2/2005 |
| JP | 2005-057186 | 3/2005 |

* cited by examiner

*Primary Examiner*—Thao P. Le
(74) *Attorney, Agent, or Firm*—Young & Thompson

(57) ABSTRACT

A semiconductor device includes a semiconductor substrate, and an electrical fuse provided on the semiconductor substrate. The electrical fuse includes a first fuse link and a second fuse link mutually connected in series, a first current inlet/outlet terminal (first terminal) and a second current inlet/outlet terminal (second terminal) respectively provided at an end and the other end of the first fuse link, and a third current inlet/outlet terminal (second terminal) and a fourth current inlet/outlet terminal (third terminal) provided at an end and the other end of the second fuse link.

17 Claims, 16 Drawing Sheets

FIG. 14

| (DISCONNECTION) | | DECISION AT START |
|---|---|---|
| Fuse1(203) | Fuse2(204) | DECISION CIRCUIT 400 |
| 1 | 1 | 1 |
| 1 | 0 | 0 |
| 0 | 1 | 0 |
| 0 | 0 | 0 |

FIG. 15

| (CHANGE OVER TIME) | | DECISION DURING USE |
|---|---|---|
| Fuse1(202) | Fuse2(204) | DECISION CIRCUIT 400 |
| 1 | 1 | 1 |
| 1 | 0 | 1 |
| 0 | 1 | 1 |
| 0 | 0 | 0 |

SEMICONDUCTOR DEVICE HAVING ELECTRICAL FUSE

This application is based on Japanese patent application NO. 2005-243346, the content of which is incorporated hereinto by reference.

BACKGROUND

1. Technical Field

The present invention relates to a semiconductor device and a method of manufacturing the same, and more particularly to a semiconductor device including an electrical fuse or an antifuse, and a method of manufacturing such semiconductor device.

2. Related Art

Semiconductor devices that include a fuse are known in the art, in which disconnecting the fuse enables adjusting a value of a resistance employed in the semiconductor device, and isolating a defective element to substitute with a normal element.

Methods of disconnecting the fuse include laser irradiation on a point to be disconnected of the fuse. JP-A No. H11-297837 discloses a technique of solving the following problem arising in the fuse disconnected by the laser irradiation. With the ongoing micronization of the design rules with respect to the semiconductor devices, interconnects to be disconnected are becoming finer. Accordingly, a laser repair apparatus employed for disconnecting a fuse interconnect is required to offer higher positioning accuracy for the laser irradiation. However, employing a brand new apparatus for each product of a newer generation only leads to continuous increase in manufacturing cost. JP-A No. H11-297837 proposes, therefore, a circuit configuration including a plurality of interconnects to be disconnected for switching an internal circuit, to thereby switch the circuit once any of the plurality of interconnects is disconnected, as a method of surely disconnecting the fuse interconnect with a one-generation older laser repair apparatus of insufficient positioning accuracy. According to the literature, such configuration reduces imperfect switching of the circuit arising from defective disconnection due to a shift of the laser irradiation position on the interconnect to be disconnected.

Apart from such method of disconnecting the fuse by laser irradiation, a method of disconnecting the fuse with a current is also known, as disclosed in JP-A No. 2005-39220 and JP-A No. 2005-57186. JP-A No. 2005-39220 discloses a fuse that can be melted with a smaller current. In JP-A No. 2005-39220, the conductor constituting the fuse is shaped so as to be folded back a plurality of times.

FIG. 12 is a plan view showing the fuse disclosed in JP-A No. 2005-39220. According to FIG. 12, the fuse 1100 is folded back twice.

The fuse 1100 includes a current inlet terminal 1101 and a current outlet terminal 1102, and a first linear portion 1103, a second linear portion 1104, and a third linear portion 1113 between the terminals. The fuse 1100 further includes a first perpendicular connecting portion 1106 connecting the first linear portion 1103 and the second linear portion 1104, and a second perpendicular connecting portion 1107 connecting the third linear portion 1113 and the second linear portion 1104.

In the fuse 1100 thus configured, when a predetermined current runs from the current inlet terminal 1101 to the current outlet terminal 1102, heat generated in a hatched section 1108 outside the fuse 1100 is added to heat generated in a hatched section 1109 inside the fuse 1100, to thereby accelerate the fusing of the second linear portion 1104 interposed between the hatched section 1109. Thus, the fuse 1100 can be easily melted apart.

JP-A No. 2005-57186 discloses a fuse in which a point to be melted apart is surrounded by a plate, such that the heat generated at the disconnection point is detained or accumulated in the vicinity thereof.

In addition, JP-A No. 2004-214580 discloses a fuse layout including an interconnect electrode having a barrier metal layer constituted of a metal having a high melting point and a main interconnect metal layer. The layout includes a plurality of melting type fuse units connected in series and a plurality of fuse pads that supplies a current to each melting type fuse. In this layout, when at least one of the fuse units is disconnected, the entire layout becomes disconnected. Accordingly, imperfect disconnection can be significantly reduced.

As shown in FIG. 12, in the fuse that can be disconnected by a current (E fuse, hereinafter referred to as electrical fuse), supplying a predetermined current from the current inlet terminal 1101 to the current outlet terminal 1102 enables disconnecting the electrical fuse. The electrical fuse can be disconnected by applying a voltage to a point between the current inlet terminal and the current outlet terminal of the electrical fuse to be disconnected, and is hence free from the problem originating from the positioning accuracy incidental to the laser irradiation for disconnecting the fuse.

However, the present inventors have discovered that the electrical fuse may incur a new problem.

SUMMARY OF THE INVENTION

The present inventors have discovered that, with respect to the electrical fuse, when the electric fuse is subjected to heat treatment after being once disconnected the electrical fuse may be reconnected at the disconnected position. In the case where the electrical fuse is constituted of a material susceptible to electromigration, the material may migrate because of the electromigration when the semiconductor device is subjected to the heat treatment after the disconnection of the electrical fuse, thus causing reconnection at the disconnected point. If such reconnection takes place, although the electrical fuse to be disconnected is once disconnected a subsequent inspection cannot provide a correct result on whether the electrical fuse is disconnected.

Also the antifuse may, as in the case of the electrical fuse, be disconnected again because of the migration of the material constituting the antifuse, when the antifuse is subjected to heat treatment after the connection thereof.

Actually the probability that the foregoing reconnection or redisconnection takes place is not critically high, and hence the problem might be regarded as negligible when the semiconductor device is put to use under a normal condition. However, in the case where the semiconductor device is required to provide extremely high accuracy or used under a severe condition, the ability of the electrical fuse to maintain the disconnected state after being disconnected, and the ability of the antifuse to maintain the connected state after being electrically connected have to be increased.

Further, taking into consideration the possibility that the foregoing reconnection or redisconnection may take place, it is desirable to ensure, immediately after disconnecting (or connecting) the fuse, that a plurality of fuses is duly disconnected (or connected) respectively, from the viewpoint of upgrading the reliability of the semiconductor device when put to practical use.

According to the present invention, there is provided a semiconductor device including:

a semiconductor substrate, and an element provided on the semiconductor substrate and including a state-changing portion that changes a disconnected state or a connected state by applying a current or a voltage, wherein the element includes:

a first state-changing portion and a second state-changing portion, a first current inlet/outlet/voltage-applying terminal and a second current inlet/outlet/voltage-applying terminal respectively provided at an end and the other end of the first state-changing portion, a third current inlet/outlet/voltage-applying terminal and a fourth current inlet/outlet/voltage-applying terminal respectively provided at an end and the other end of the second state-changing portion, a decision unit that decides whether the first state-changing portion and the second state-changing portion are both disconnected, and outputs a result of a decision, and the first state-changing portion and the second state-changing portion are connected so as to allow detecting a change of a state of the element when at least one of the first state-changing portion and the second state-changing portion changes.

Herein, the "element" may be an electrical fuse or an antifuse. When the "element" is the electrical fuse, the "state-changing portion" may be a fuse link. In this case, the first state-changing portion and the second state-changing portion are connected in series. When the "element" is the antifuse, the "state-changing portion" may be a link portion to be electrically connected by application of a voltage. In this case, the first state-changing portion and the second state-changing portion are connected in parallel.

The semiconductor device thus constructed enables, when changing the state-changing portion in the element, surely changing both of the two state-changing portions, and allows detecting, when performing the detection of the state of the element, that the state of the element has changed if either of the two state-changing portions remains in the changed state, even though the other of the two state-changing portions has restored to the original state. Thus, the structure upgrades the ability of the element to maintain the state.

According to the present invention, there is provided a semiconductor device including:

a semiconductor substrate, and an electrical fuse provided on the semiconductor substrate, wherein the electrical fuse includes:

a first fuse link and a second fuse link connected in series, a first current inlet/outlet terminal and a second current inlet/outlet terminal respectively provided at an end and the other end of the first fuse link, a third current inlet/outlet terminal and a fourth current inlet/outlet terminal respectively provided at an end and the other end of the second fuse link, and a decision unit that decides whether the first fuse link and the second fuse link are both disconnected, and outputs a result of a decision.

The electrical fuse stands for a fuse that can be disconnected by applying a current or a voltage. The fuse link means the portion to be disconnected in the electrical fuse. The first fuse link and the second fuse link are both designed so as to be disconnected when a current exceeding a predetermined value is supplied thereto. Here, whether the electrical fuse is disconnected is detected depending on whether the two fuse links connected in series are disconnected.

In an embodiment of the present invention, the decision unit may decide whether both of the first fuse link and the second fuse link are disconnected, and output the result of the decision. Such arrangement enables deciding, immediately after disconnecting the fuse, whether the two fuse links are both duly disconnected. Therefore, the premise that a plurality of fuse links is surely disconnected can be established, even though the foregoing reconnection may ever take place, which results in upgraded reliability of the product when put to practical use.

In the semiconductor device according to the present invention, since the two fuse links included in the electrical fuse are connected in series, the current that has passed through the two fuse links in the electrical fuse can be detected. Accordingly, although one of the two fuse links is reconnected, the electrical fuse can be detected as being disconnected, as long as the other fuse link remains disconnected. Such structure reduces the reconnection probability significantly, or by a unit of a square, in comparison with an electrical fuse including only one fuse link. Here, the "reconnection probability" means the possibility that the fuse link in the disconnected electrical fuse becomes reconnected, so that the electrical fuse is detected as being connected. The foregoing structure, therefore, allows increasing the ability of the electrical fuse to maintain its state in the semiconductor device.

The present invention aims, unlike the technique disclosed in JP-A No. H11-297837, at significantly reducing the reconnection probability in the electrical fuse, and thus increasing the ability thereof to maintain its state. To reduce the reconnection probability, the two fuse links are required to be surely disconnected in the electrical fuse, upon disconnecting the fuse links. If only either of the two fuse links is disconnected upon disconnecting the electrical fuse, the reconnection probability of the electrical fuse cannot be reduced.

The two fuse links included in the electrical fuse may be configured such that one of the fuse links can be disconnected irrespective of whether the other fuse link is disconnected. In the semiconductor device according to the present invention, since the two fuse links in the electrical fuse are provided with the current inlet terminal and the current outlet terminal at the respective ends thereof, a voltage can be independently applied to the ends of the respective fuse links. Unless the electrical fuse is thus configured to allow independent application of a voltage to the respective fuse links, the both of the two fuse links cannot be surely disconnected though the electrical fuse includes two fuse links. For example, in the case where the electrical fuse is configured such that a voltage is collectively applied to the two fuse links connected in series from the outer sides, if one of the fuse links is first disconnected, the current is kept from flowing through the other fuse link, resulting in failure in disconnecting the other fuse link. According to the present invention, since the two fuse links included in the electrical fuse are provided with the current inlet terminal and the current outlet terminal at the respective ends thereof, each of the two fuse links in the electrical fuse can be surely disconnected.

Further, the semiconductor device according to the present invention includes the decision unit. The decision unit decides whether each of the two fuse links is disconnected. Here, when the probability of reconnection of one of the fuse links due to a change over time is denoted by p ($0<p<1$), the probability of reconnection of all the n pieces of fuses is $p^n$. Accordingly, when the decision unit outputs a negative result (i.e. when one of the fuse links is not disconnected), executing the disconnection again to ensure that both of the two fuse links are disconnected reduces the probability that the change over time affects an output of a signal output unit that outputs whether the electrical fuse is disconnected state or not. In other words, the probability of the change over time of the fuse is substantially reduced.

The electrical fuse may take various structure procided that the first fuse link and the second fuse link are configured such that a voltage can be independently applied to each thereof, and hence one of the terminals of the first fuse link and one of the terminals of the second fuse link may be structured by one and the same terminal. For example, the second current inlet/outlet terminal and the third current inlet/outlet terminal may be structured by one and the same terminal. Such configuration still enables surely disconnecting the first fuse link and the second fuse link.

Also, the first fuse link and the second fuse link may be connected in series via a switch element such as a transistor. For example, the first fuse link may be connected to one of the source/drain of the transistor, and the second fuse link may be connected to the other of the source/drain. Under such configuration, when disconnecting the first fuse link and the second fuse link, the transistor may be turned off to thereby disconnect each of the first fuse link and the second fuse link, and when detecting the disconnection state of the electrical fuse, the transistor may be turned on so as to detect the current that has passed through the first fuse link and the second fuse link.

According to the present invention, there is provided a method of manufacturing a semiconductor device including a semiconductor substrate, and a plurality of electrical fuses provided on the semiconductor substrate and respectively including a first fuse link and a second fuse link connected in series, including:

selecting the electrical fuse to be disconnected, disconnecting the first fuse link and the second fuse link respectively in the electrical fuse selected in the step of selecting the electrical fuse, detecting a connection state of the electrical fuse after the step of disconnecting the first fuse link and the second fuse link, and deciding whether the first fuse link and the second fuse link are both disconnected, and outputting a result of a decision.

The method thus arranged allows surely disconnecting each of the first fuse link and the second fuse link. Here, the step of disconnecting the first fuse link and the second fuse link may include supplying a current from an end to the other end of the first fuse link thus to disconnect the first fuse link, and supplying a current from an end to the other end of the second fuse link thus to disconnect the second fuse link. The disconnecting the first fuse link and the disconnecting the second fuse link may be performed sequentially or at a time, as long as the first fuse link and the second fuse link can be independently disconnected.

According to the present invention, there is provided a semiconductor device including:

a semiconductor substrate, and an antifuse provided on the semiconductor substrate, wherein the antifuse includes:

a first link portion and a second link portion connected in parallel, and to be electrically connected by respectively applying a predetermined voltage, a first voltage-applying terminal and a second voltage-applying terminal respectively provided at an end and the other end of the first link portion, a third voltage-applying terminal and a fourth voltage-applying terminal respectively provided at an end and the other end of the second link portion, and a decision unit that decides whether the first link portion and the second link portion are both connected, and outputs a result of a decision.

The link portion stands for the portion to be connected in the antifuse. Here, the antifuse may take various structure provided that the first link portion and the second link portion are connected in parallel at least when detecting whether the antifuse is connected.

In the semiconductor device according to the present invention, since the two link portions included in the antifuse are connected in parallel, the current that has passed through either of the two link portions in the antifuse can be detected. Accordingly, although one of the two link portions is redisconnected, the antifuse can be detected as being connected, as long as the other link portion remains connected. Such structure reduces the redisconnection probability by a unit of a square, in comparison with an antifuse including only one link portion. Here, the "redisconnection probability" means the possibility that the link portion in the electrically connected antifuse becomes redisconnected, so that the antifuse is detected as being disconnected. The foregoing structure, therefore, allows increasing the ability of the antifuse to maintain its state in the semiconductor device.

In the case of the antifuse also, to reduce the redisconnection probability, the two link portions are required to be surely connected in the antifuse, upon connecting the link portions. In the semiconductor device according to the present invention, since the two link portions included in the antifuse are provided with the voltage-applying terminal at respective ends thereof, the voltage can be independently applied to each of the two link portions. Thus, each of the link portions in the antifuse can be surely connected.

According to the present invention, there is provided a method of manufacturing a semiconductor device including a semiconductor substrate, and a plurality of antifuses provided on the semiconductor substrate, and respectively including a first link portion and a second link portion connected in parallel and to be electrically connected by respectively applying a predetermined voltage, including:

selecting the antifuse to be connected, electrically connecting the first link portion and the second link portion respectively in the antifuse selected in the step of selecting the antifuse, detecting a connection state of the antifuse with the first link portion and the second link portion being connected in parallel, after the step of electrically connecting the first link portion and the second link portion, and deciding whether the first link portion and the second link portion are both connected, and outputting a result of a decision.

The method thus arranged allows surely connecting each of the first link portion and the second link portion. Here, the step of connecting the first link portion and the second link portion respectively may include applying a voltage from an end to the other end of the first link portion thus to connect the first link portion, and applying a voltage from an end to the other end of the second link portion thus to connect the second link portion. The step of connecting the first link portion and connecting the second link portion may be performed sequentially or at a time, as long as each of the first link portion and the second link portion can be independently connected.

Thus, the present invention can increase the ability of an electrical fuse or an antifuse to maintain its state.

BRIEF DESCRIPTION OF THE DRAWINGS

The above and other objects, advantages and features of the present invention will be more apparent from the following description taken in conjunction with the accompanying drawings, in which:

FIG. 14 is a table showing decision results and signals to be output by a decision circuit after a disconnection process;

FIG. 15 is a table showing decision results and signals to be output by a decision circuit during the use.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
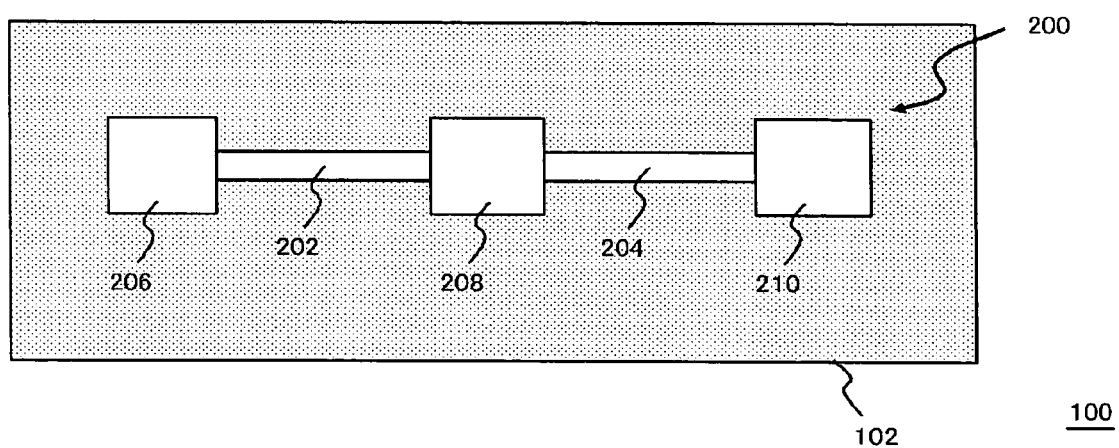
FIG. 1 is a plan view showing a configuration of a semiconductor device including an electrical fuse according to an embodiment of the present invention.

FIG. 1 is a plan view showing a configuration of a semiconductor device including an electrical fuse according to the embodiment of the present invention.

In this embodiment, the semiconductor device 100 includes a semiconductor substrate (not shown), an insulating layer 102 provided on the semiconductor substrate, and an electrical fuse 200 provided on/in the insulating layer. The electrical fuse 200 includes a first fuse link 202 and a second fuse link 204 mutually connected in series, a first terminal 206, a second terminal 208, and a third terminal 210. The first fuse link 202 and the second fuse link 204 are both constituted of a conductive material, and designed so as to be disconnected (cut) when a current exceeding a predetermined value is supplied thereto.

The first terminal 206 and the second terminal 208 are respectively provided at an end and the other end of the first fuse link 202, and serve as a current inlet terminal and a current outlet terminal when disconnecting the first fuse link 202 by applying a current. The second terminal 208 and the third terminal 210 are respectively provided at an end and the other end of the second fuse link 204, and serve as a current inlet terminal and a current outlet terminal (or a current inlet terminal) when disconnecting the second fuse link 204 by applying a current. In this embodiment, the current outlet terminal of the first fuse link 202 and the current input terminal (or a current outlet terminal) of the second fuse link 204 are one and the same terminal (the second terminal 208).

In this embodiment, the first fuse link 202 and the second fuse link 204 may be constituted of a copper-containing metal layer predominantly composed of copper. The copper-containing metal layer may contain silver. Further, the copper-containing metal layer may contain one or a plurality of dissimilar elements selected out of the group consisting of Au, Pt, Cr, Mo, W, Mg, Be, Zn, Pd, Cd, Hg, Si, Zr, Ti, and Sn.

In this embodiment, the insulating layer 102 may be any of those insulating layers provided on the semiconductor substrate, and examples thereof include an element isolation insulating layer, one of interlayer dielectrics among a multilayer interconnect structure, and an insulating layer formed on a bottom portion of a trench.

Referring now to FIGS. 2A to 2C and 13, a process for disconnecting the electrical fuse 200 thus configured with a current will be described hereunder. Here, the first fuse link 202 and the second fuse link 204 can be independently supplied with a voltage. In other words, either of the first fuse link 202 or the second fuse link 204 can be disconnected irrespective of whether the other thereof is disconnected.

Figure 13:
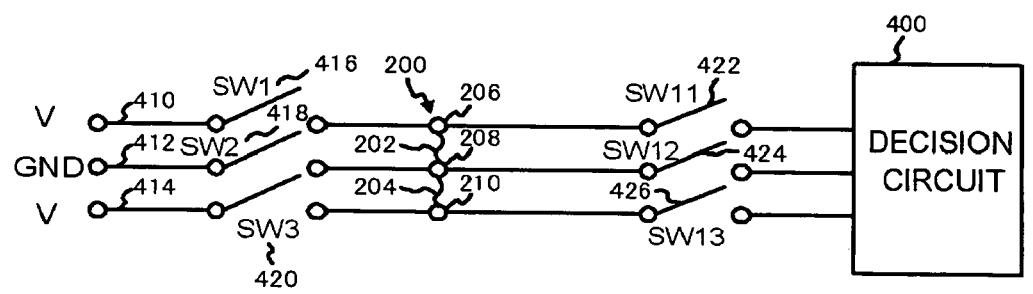
FIG. 13 is a schematic diagram showing a configuration of a semiconductor device including a circuit for disconnecting an electrical fuse.

FIG. 13 is a schematic diagram showing a configuration of the semiconductor device 100 including a circuit for disconnecting the electrical fuse 200.

The semiconductor device 100 further includes a first interconnect 410 connected to the first terminal 206, a second interconnect 412 connected to the second terminal 208, and a third interconnect 414 connected to the third terminal 210. An end of the first interconnect 410 and the third interconnect 414 are respectively connected to a voltage source V. An end of the second interconnect 412 is grounded. The other end of the first interconnect 410, the second interconnect 412, and the third interconnect 414 are respectively connected to a decision circuit 400. On the first interconnect 410, a first switch 416 (SW1) is provided between the first terminal 206 and the voltage source V, and a fourth switch 422 (SW11) is provided between the first terminal 206 and the decision circuit 400, respectively. Likewise, on the second interconnect 412, a second switch 418 (SW2) is provided between the second terminal 208 and the ground point GND, and a fifth switch 424 (SW12) is provided between the second terminal 208 and the decision circuit 400, respectively. Also, on the third interconnect 414, a third switch 420 (SW3) is provided between the third terminal 210 and the voltage source V, and a sixth switch 426 (SW13) is provided between the third terminal 210 and the decision circuit 400, respectively.

Although not shown, the semiconductor device 100 may include a plurality of electrical fuses 200. Firstly, one of the electrical fuses 200 to be disconnected is selected. In this embodiment, in the electrical fuse 200 selected to be disconnected, the first fuse link 202 and the second fuse link 204 are respectively disconnected.

A process of disconnecting with a current the first fuse link 202 in the electrical fuse 200 selected to be disconnected will be first described. It is assumed here that the first switch 416 and the second switch 418 are turned on, and the other switches are off. Under such state, a predetermined high potential (for example the source voltage VCC) is applied to the first terminal 206, and a predetermined low potential (ground potential) is applied to the second terminal 208. At this stage, the third terminal 210 is in a floating state and hence the current does not run between the second terminal 208 and the third terminal 210. Accordingly, the current runs from the first terminal 206 toward the second terminal 208, so that the first fuse link 202 is disconnected.

Figure 2A:
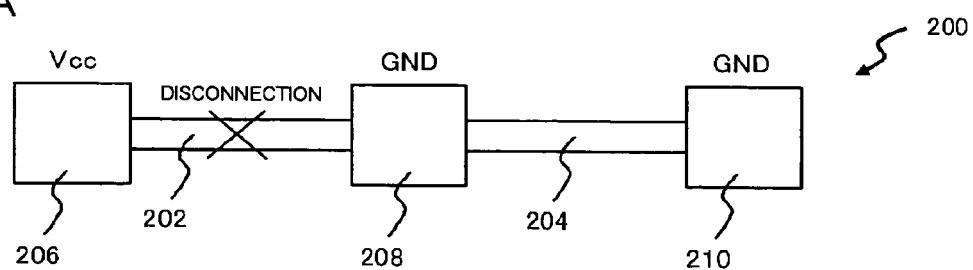
FIGS. 2A to 2C are schematic diagrams for explaining a disconnection process of the electrical fuse shown in FIG. 1 by applying a current.

In another example, the same potential as that given to the second terminal 208 may be given to the third terminal 210, so as to inhibit the current from running between the second terminal 208 and the third terminal 210. For example, the second terminal 208 and the third terminal 210 may be grounded (as shown in FIG. 2A).

Then the decision circuit 400 decides whether the first fuse link 202 is disconnected. At this stage, the first switch 416 and the second switch 418 are turned off, and the fourth switch 422 and the fifth switch 424 are turned on. The other switches are kept off. Here, the decision circuit 400 detects the resistance value between the first terminal 206 and the second terminal 208. The decision circuit 400 may decide that the first fuse link 202 is disconnected when the resistance value is not less than a predetermined value (for instance, 1 kΩ).

Now a process for disconnecting the second fuse link 204 with a current will be described. Here the second switch 418 and the third switch 420 are turned on, and the other switches are off. Under such state, a predetermined high potential (for example the source voltage VCC) is applied to the third terminal 210, and a predetermined low potential (ground potential) is applied to the second terminal 208. At this stage, the first terminal 206 is in a floating state and hence the current does not run between the first terminal 206 and the second terminal 208. Accordingly, the current runs from the second terminal 208 toward the third terminal 210, so that the second fuse link 204 is disconnected.

Figure 2B:
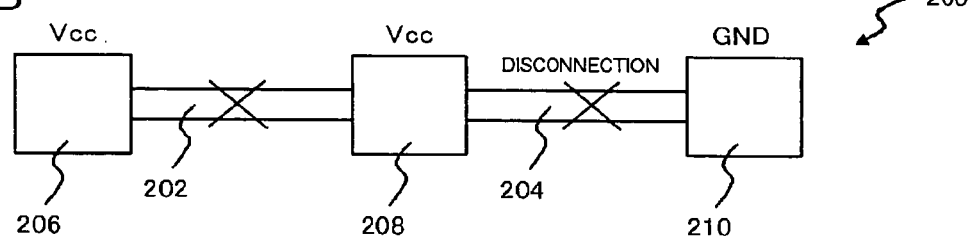
Figure 2C:
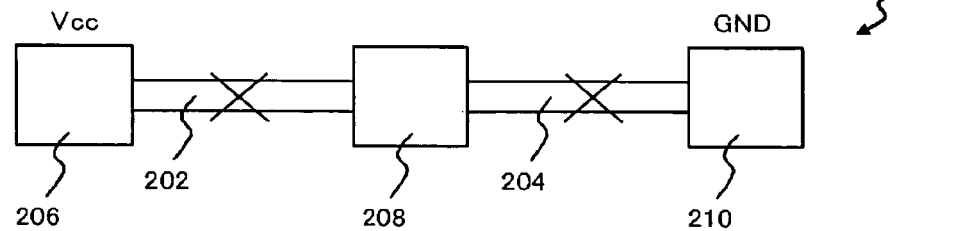

In another example, the same potential as that given to the second terminal 208 may be given to the first terminal 206, so as to inhibit the current from running between the first terminal 206 and the second terminal 208. For example, the high potentials may be applied to both the first terminal 206 and the second terminal 208 and the third terminal 210 may be grounded (as shown in FIG. 2B).

Then the decision circuit 400 decides whether the second fuse link 204 is disconnected. At this stage, the second switch 418 and the third switch 420 are turned off, and the fifth switch 424 and the sixth switch 426 are turned on. The other switches are kept off. Here, the decision circuit 400 detects the resistance value between the second terminal 208 and the third terminal 210. The decision circuit 400 may decide that the second fuse link 204 is disconnected when the resistance value is not less than a predetermined value (for instance, 1 kΩ).

Through the foregoing process, the two fuse links can be surely disconnected respectively, in the electrical fuse 200.

In this embodiment, the electrical fuse 200 may be configured such that the use thereof is permitted only when the decision circuit 400 decides, as a result of the detection, that the first fuse link 202 and the second fuse link 204 are both disconnected, immediately after the disconnection process or before starting to use the electrical fuse 200. The decision circuit 400 may be configured so as to retain the decision result on the disconnection state of the first fuse link 202 and the decision result on the disconnection state of the second fuse link 204. The decision circuit 400 decides whether the first fuse link 202 and the second fuse link 204 are both disconnected, and outputs a signal indicating that the electrical fuse 200 is non-defective when both of them are disconnected, but outputs a signal indicating that the electrical fuse is defective, when only one of them is disconnected or when neither of them is disconnected. FIG. 14 is a table showing the decision results and signals to be output by the decision circuit 400 after the disconnection process. In FIG. 14, "1" denotes the decision of being disconnected, and "0" denotes the decision of not being disconnected (in other words, the decision of being connected). The decision circuit 400 outputs the signal "1" indicating that the electrical fuse 200 is non-defective, only when the decision results with respect to the first fuse link 202 and the second fuse link 204 are both "1". The decision circuit 400 outputs the signal "0" indicating that the electrical fuse 200 is defective, in all the other cases. In other words, the decision circuit 400 performs an AND decision immediately after the disconnection process (and at starting to use the electrical fuse 200). Such arrangement reduces the probability that the change over time affects an output of a signal output unit. Thus, the probability of the change over time of the fuse is substantially reduced.

The decision process performed during the use of the electrical fuse 200 will now be described hereunder. The decision on whether the electrical fuse 200 is disconnected during the use thereof may be obtained by supplying a current between the first terminal 206 and the third terminal 210. Assuming that, in the configuration shown in FIG. 13, the fourth switch 422 and the sixth switch 426 are turned on, for example a predetermined signal (VCC) is input through the first terminal 206, so that the signal is output through the third terminal 210. The other switches are turned off. Under such state, the decision circuit 400 detects a resistance value between the first terminal 206 and the third terminal 210.

FIG. 15 is a table showing the decision results and signals to be output by the decision circuit 400 during the use of the electrical fuse 200. In FIG. 15, "1" denotes the decision of being disconnected, and "0" denotes the decision of not being disconnected. The decision circuit 400 outputs the signal "1" indicating that the electrical fuse 200 is disconnected, when at least one of the decision results with respect to the first fuse link 202 and the second fuse link 204 is "1". The decision circuit 400 outputs the signal "0" indicating that the electrical fuse 200 is not disconnected, only when the decision results with respect to the first fuse link 202 and the second fuse link 204 are both "0". In other words, the decision circuit 400 performs an OR decision during use of the electrical fuse 200.

Connecting the first fuse link 202 and the second fuse link 204 in series, as in the electrical fuse 200, enables deciding that the electrical fuse 200 is disconnected when at least one of the first fuse link 202 and the second fuse link 204 is disconnected. Accordingly, even though the first fuse link 202 and the second fuse link 204 may be reconnected owing to a heat treatment performed after the disconnection of the electrical fuse 200, the reconnection probability of the electrical fuse 200 can be reduced by a unit of a square. For example, when the reconnection probability of one of the fuse links due to the heat treatment after the disconnection is 1E-4, the reconnection probability of the electrical fuse 200 becomes 1E-8 when the electrical fuse 200 includes two fuse links.

In another embodiment, the decision circuit 400 may be engaged in controlling the application of a voltage for disconnecting the first fuse link 202 and the second fuse link 204.

Figure 3:
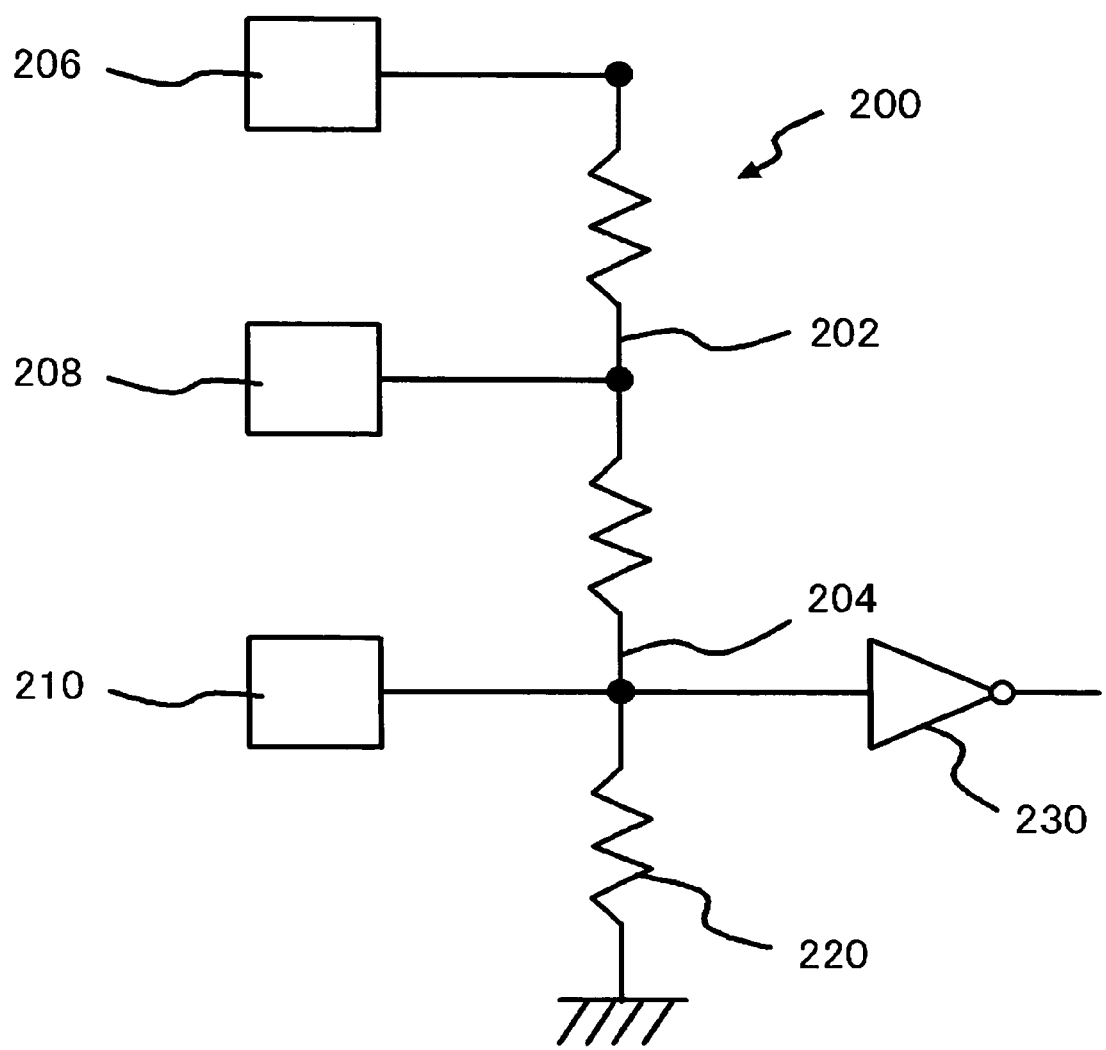
FIG. 3 is a circuit diagram of a circuit for controlling a potential level in which the electrical fuse shown in FIG. 1 is introduced.

FIG. 3 is a circuit diagram of a circuit for controlling a potential level in which the electrical fuse 200 shown in FIG. 1 is introduced.

An end of the electrical fuse 200 on the side of the second fuse link 204 is connected to an end of a resistance 220. The other end of the resistance 220 is grounded. Between the second fuse link 204 and the resistance 220, an inverter 230 is connected.

Here, the first terminal 206 receives the source voltage VCC. Under such circuit configuration, a high level signal is input to the inverter 230 when the electrical fuse 200 is not disconnected. At this moment, the inverter 230 outputs a low level signal. On the other hand, when the electrical fuse 200 is disconnected, the inverter 230 receives an input of the low level signal, and outputs a high level signal. Thus, the potential level of an output destination of the inverter 230 can be controlled according to the disconnection state of the electrical fuse 200.

In this embodiment, since the electrical fuse 200 includes two fuse links, the reconnection probability can be significantly reduced in the electrical fuse 200 selected for disconnection and actually disconnected. Such structure allows precisely controlling the potential level in the circuit as shown in FIG. 3.

In this embodiment, the first fuse link 202 and the second fuse link 204 in the electrical fuse 200 may be formed in various shapes. Some examples will be cited hereunder.

Figure 4A:
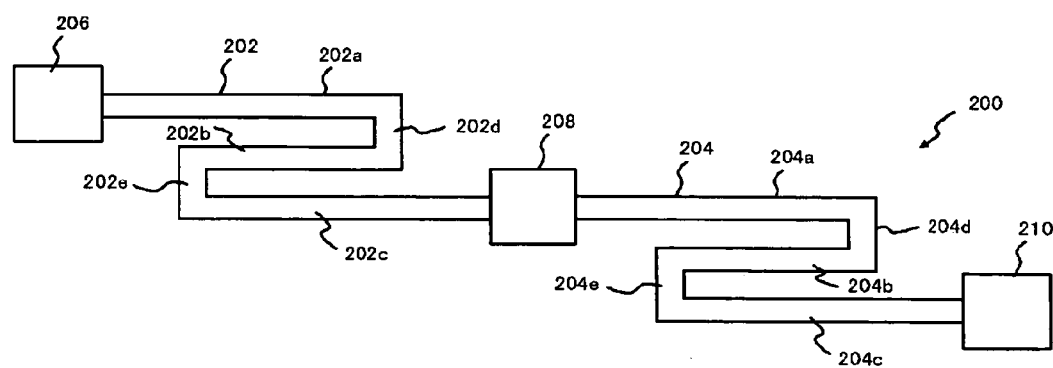
FIGS. 4A and 4B are plan views showing variations of the electrical fuse according to the embodiment of the present invention.
Figure 4B:
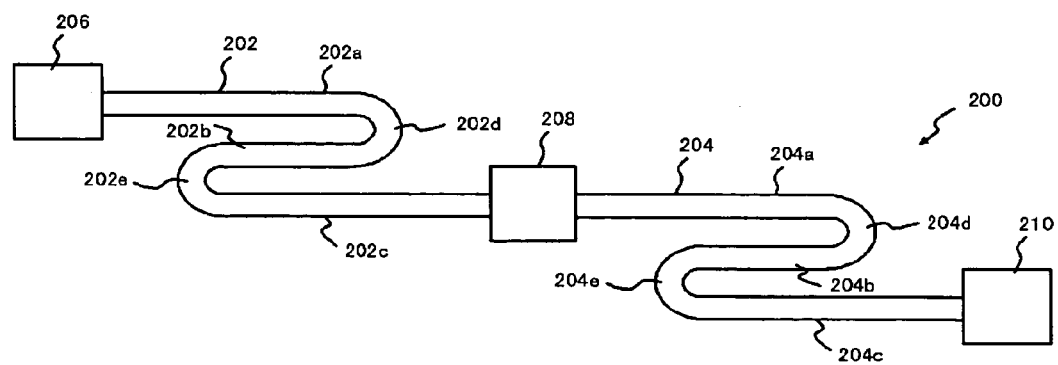

FIGS. 4A and 4B are plan views showing variations of the electrical fuse 200 according to this embodiment.

The first fuse link 202 and the second fuse link 204 may include a fold-back portion between the first terminal 206 and the second terminal 208, and between the second terminal 208 and the third terminal 210, respectively. Here, "fold back" means that the portion is bent backward in an angle larger than 90 degrees.

Referring to FIG. 4A, the first fuse link 202 includes a linear portion 202a, a linear portion 202b, a linear portion 202c, a connecting portion 202d connecting the linear portion 202a and the linear portion 202b, and a connecting portion 202e connecting the linear portion 202b and the linear portion 202c. The linear portion 202a, the linear portion 202b, and the linear portion 202c are disposed generally in parallel to one another. The second fuse link 204 includes a linear portion 204a, a linear portion 204b, a linear portion 204c, a connecting portion 204d connecting the linear portion 204a and the linear portion 204b, and a connecting portion 204e connecting the linear portion 204b and the linear portion 204c. The linear portion 204a, the linear portion 204b, and the linear portion 204c are disposed generally in parallel to one another.

Hereinafter, a direction from the first terminal 206 toward the second terminal 208 will be referred to as a heading direction. The first fuse link 202 is bent to the right from the heading direction by approx. 90 degrees at the connection point between the linear portion 202a and the connecting portion 202d, and bent again to the right from the heading direction by approx. 90 degrees at the connection point between the connecting portion 202d and the linear portion 202b. Accordingly, the first fuse link 202 is bent by 180 degrees, i.e. folded back once. Likewise, the first fuse link 202 is bent to the left from the heading direction by approx. 90 degrees at the connection point between the linear portion 202b and the connecting portion 202e, and bent again to the left from the heading direction by approx. 90 degrees at the connection point between the connecting portion 202e and the linear portion 202c. Accordingly, the first fuse link 202 is bent again by 180 degrees, i.e. folded back one more time. Thus, in the example shown in FIG. 4A, the first fuse link 202 is folded back twice in total. The second fuse link 204, similarly shaped to the first fuse link 202, is also folded back twice in total.

In the electrical fuse 200 shaped as above, when a predetermined current runs from the first terminal 206 toward the second terminal 208, heat generated outside the first fuse link 202 is added to heat generated inside the first fuse link 202. Accordingly, the linear portion 202b located in a central portion is efficiently heated in particular, and the disconnection thereof is accelerated. Thus, the first fuse link 202 can be disconnected with a smaller current.

Likewise, in the electrical fuse 200, when a predetermined current runs from the second terminal 208 toward the third terminal 210, heat generated outside the second fuse link 204 is added to heat generated inside the second fuse link 204. Accordingly, the linear portion 204b located in a central portion is efficiently heated in particular, and the disconnection thereof is accelerated. Thus, the second fuse link 204 can be disconnected with a smaller current.

In the example shown in FIG. 4A, the first fuse link 202 and the second fuse link 204 may be buried in a recess formed in the insulating layer 102. Such structure allows the first fuse link 202 and the second fuse link 204 to be more effectively heated when the current is supplied to the first fuse link 202 and the second fuse link 204, thus further facilitating the disconnection of the first fuse link 202 and the second fuse link 204.

Alternatively, as shown in FIG. 4B, the connecting portion 202d, the connecting portion 202e, the connecting portion 204d, and the connecting portion 204e may be formed in a curved shape. In FIG. 4B also, the first fuse link 202 is folded back by 180 degrees at the connecting portion 202d, and again folded back by 180 degrees at the connecting portion 202e, twice in total. This also applies to the second fuse link 204. Such configuration also offers the advantages as those offered by the example of FIG. 4A.

Folding back thus the first fuse link 202 and the second fuse link 204 a plurality of times in the electrical fuse 200 can locate the central linear portion of the plurality of linear portions constituting the fuse link between other linear portions constituting the fuse link and the connecting portions. Because of such configuration, when a current is supplied to the fuse link, the heat generated in the surrounding linear portions and connecting portions propagates to the central linear portion, thereby keeping the temperature of the central linear portion at a relatively higher level. This facilitates the electromigration of the material constituting the fuse link in a high temperature zone, thus further urging the disconnection of the fuse link.

Figure 5:
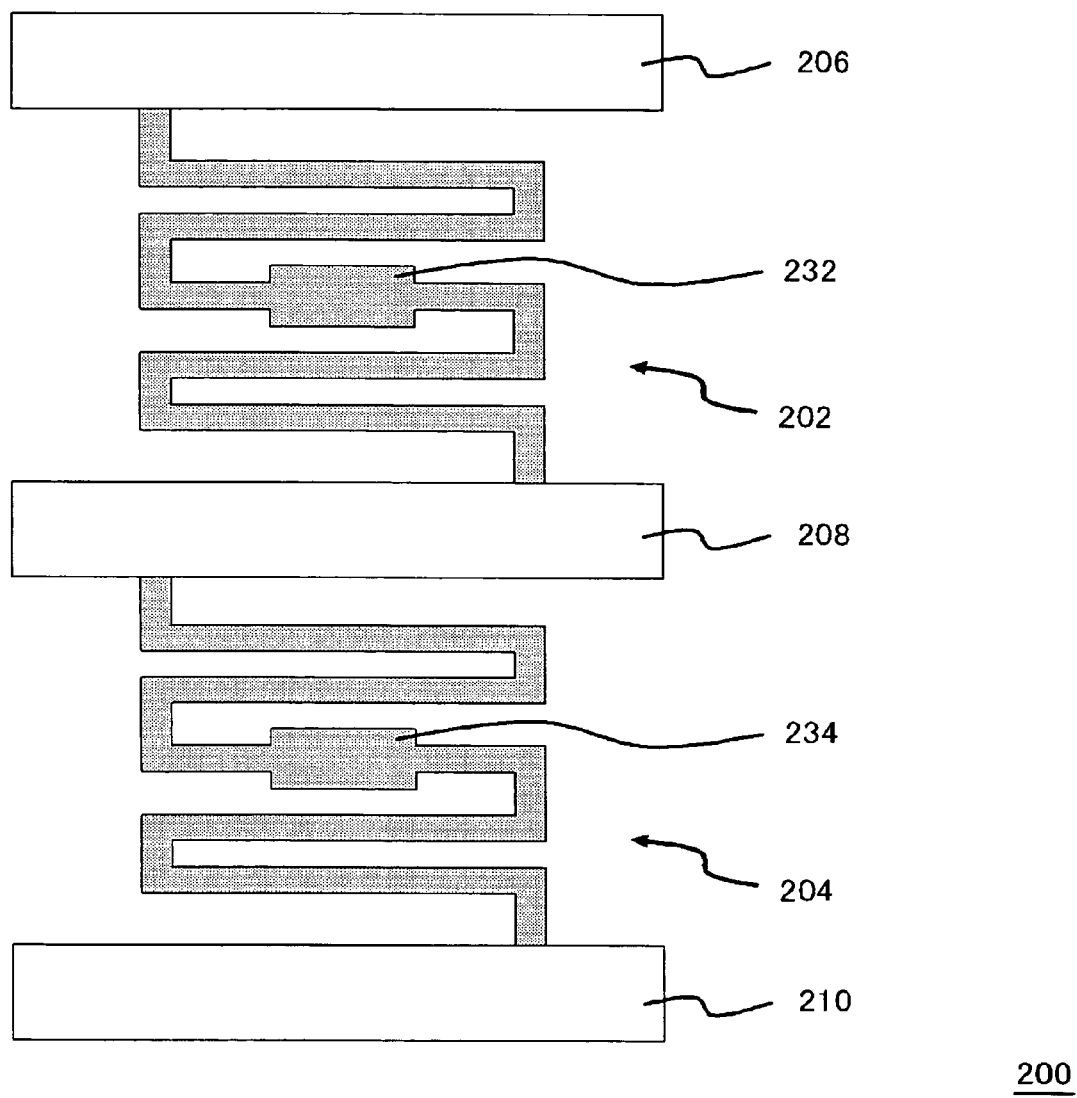
FIG. 5 is a plan view showing another variation of the electrical fuse according to the embodiment of the present invention.

FIG. 5 is a plan view showing another variation of the electrical fuse 200 according to the embodiment.

In FIG. 5, the first fuse link 202 is folded back four times and includes a widened portion 232 of a thicker wire in a central linear portion of a plurality of linear portions. The widened portion 232 is made wider than the linear portions and connecting portions. Providing such widened portion 232 leads to an increase in amount of the material constituting the first fuse link 202 that migrates in the widened portion 232, when disconnecting the first fuse link 202 utilizing the electromigration. Besides, since the widened portion 232 is located at a central portion of the first fuse link 202, the widened portion 232 is more efficiently heated. Accordingly, the electromigration can be easily provoked at the widened portion 232. This facilitates the disconnection of the fuse link 202 at a location between the widened portion 232 and the fold-back portion close thereto.

The second fuse link 204 may also include, as the first fuse link 202, a widened portion 234 of a thicker wire in a central linear portion. This facilitates the disconnection of the second fuse link 204.

Figure 6:
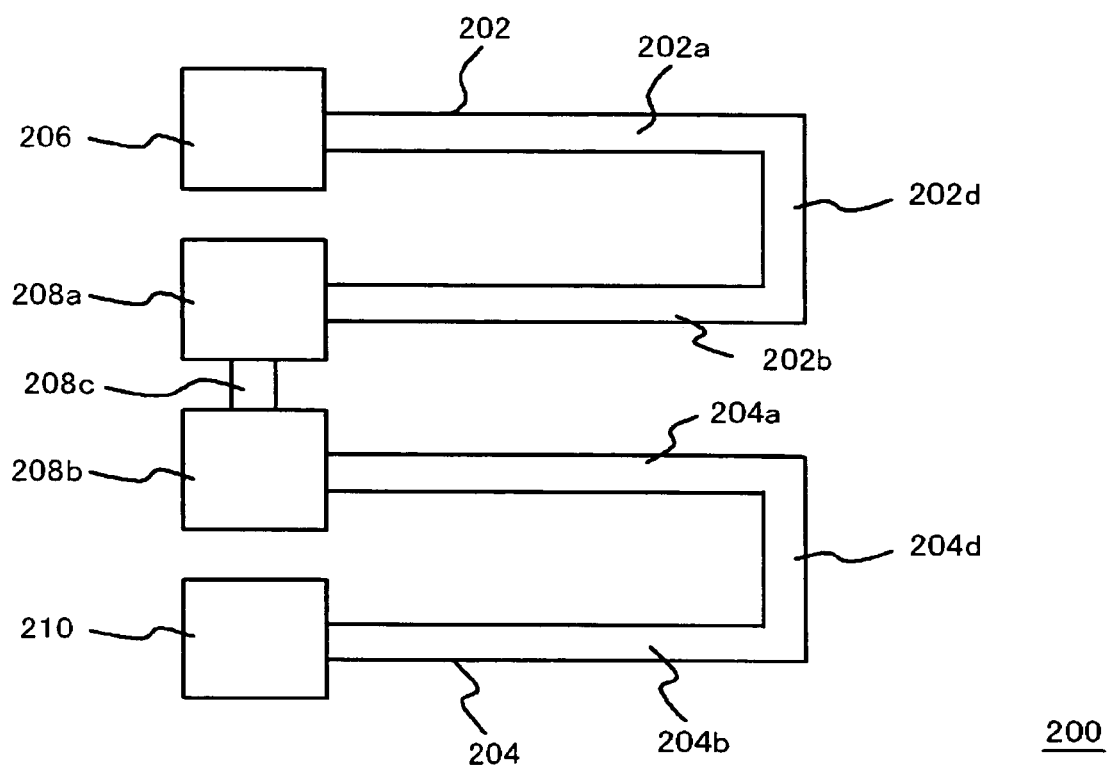
FIG. 6 is a plan view showing still another variation of the electrical fuse according to the embodiment of the present invention.

FIG. 6 is a plan view showing still another variation of the electrical fuse 200 according to the embodiment.

In FIG. 6, the first fuse link 202 and the second fuse link 204 are respectively folded back once by 180 degrees.

The first fuse link 202 includes a linear portion 202a, a linear portion 202b, and a connecting portion 202d connecting the linear portion 202a and the linear portion 202b. The linear portion 202a and the linear portion 202b are disposed generally in parallel to each other. The second fuse link 204 includes a linear portion 204a, a linear portion 204b, and a connecting portion 204d connecting the linear portion 204a and the linear portion 204b. The linear portion 204a and the linear portion 204b are disposed generally in parallel to each other. The electrical fuse 200 further includes the first terminal 206 and a fourth terminal 208a respectively connected to each end of the first fuse link 202, a fifth terminal 208b and the third terminal 210 respectively connected to each end of the second fuse link 204, and a connecting portion 208c connecting the fourth terminal 208a and the fifth terminal 208b.

Hereinafter, a direction from the first terminal 206 toward the fourth terminal 208a in the first fuse link 202 will be referred to as a heading direction. Also, a direction from the fifth terminal 208b toward the third terminal 210 in the second fuse link 204 will be referred to as a heading direction. The first fuse link 202 is bent to the right from the heading direction by approx. 90 degrees at the connection point between the linear portion 202a and the connecting portion 202d, and again bent to the right from the heading direction by approx. 90 degrees at the connection point between the connecting portion 202d and the linear portion 202b. Accordingly, the first fuse link 202 is bent by 180 degrees, i.e. folded back once. The second fuse link 204 is bent to the right from the heading direction by approx. 90 degrees at the connection point between the linear portion 204a and the connecting portion 204d, and again bent to the right from the heading direction by approx. 90 degrees at the connection point between the connecting portion 204d and the linear portion 204b. Accordingly, the second fuse link 204 is bent by 180 degrees, i.e. folded back once.

Here, the linear portions and the connecting portions connected thereto are disposed generally perpendicularly to each other. Such configuration better facilitates the disconnection of the first fuse link 202 and the second fuse link 204 with a current, than in the case of straightly aligning the first fuse link 202 and the second fuse link 204.

Further details will be described with respect to the linear portion 202a and the connecting portion 202d as an example. The linear portion 202a and the connecting portion 202d are disposed generally perpendicularly to each other. Accordingly, a less amount of the material constituting the first fuse link 202 migrates in such connection points, than in the remaining portions. Creating thus difference in amount of the migrating material constituting the first fuse link 202 depending on the location facilitates the disconnection of the first fuse link 202 at the location where a less amount of material migrates, when disconnecting the first fuse link 202 utilizing the electromigration. This also applies to other connection points, and to the second fuse link 204 as well.

In the example shown in FIG. 6 also, the connecting portion 202d and the connecting portion 204d may be formed in a curved shape, as in FIG. 4B. Such configuration also facilitates reducing the amount of the migrating material constituting the first fuse link 202 and the second fuse link 204 at the curved portions. This facilitates the disconnection at the location where a less amount of material migrates.

Figure 7:
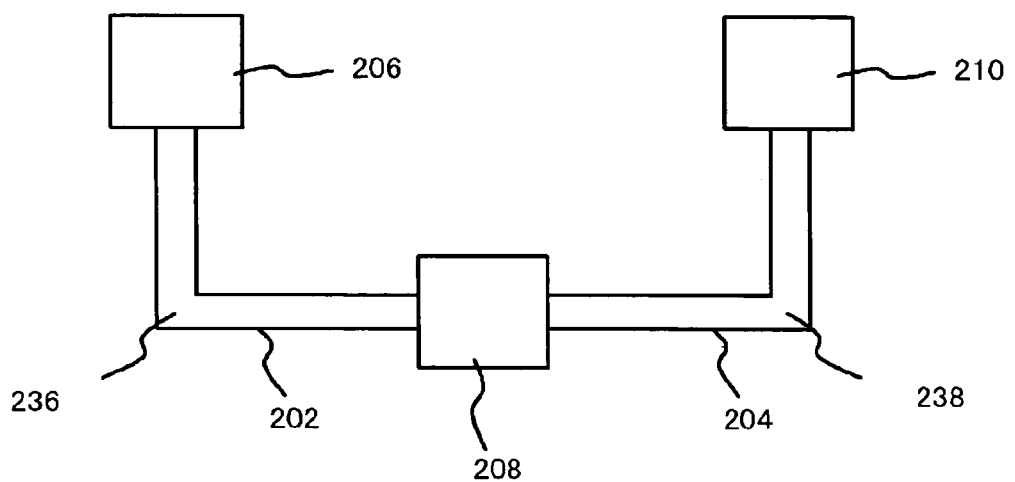
FIG. 7 is a plan view showing still another variation of the electrical fuse according to the embodiment of the present invention.

FIG. 7 is a plan view showing still another variation of the electrical fuse 200 according to the embodiment.

In FIG. 7, the first fuse link 202 and the second fuse link 204 respectively include a bent portion 236 and a bent portion 238. Such configuration can also facilitates reducing the amount of the migrating material constituting the first fuse link 202 and the second fuse link 204 at the bent portions. This facilitates the disconnection at the location where a less amount of material migrates.

Although the embodiments of the present invention have been described referring to the drawings, the foregoing embodiments are only exemplary and various other structures may be employed.

Although the electrical fuse 200 includes two fuse links in the foregoing embodiments, the electrical fuse 200 may include three or more fuse links. In this case also, each fuse link may be provided with a pair of terminals at the respective ends, so as to independently receive a voltage. With such configuration, each fuse link of the electrical fuse including a plurality of fuse links can be surely disconnected. Also, the plurality of fuse links may be connected in series. Increasing thus the number of fuse links included in the electrical fuse 200 can significantly reduce the reconnection probability.

The plurality of fuse links included in the electrical fuse 200 may be formed in generally the same shape. This facilitates disconnecting the fuse links under the same condition, thereby simplifying the process.

Also, although the first fuse link 202 and the second fuse link 204 are constituted of a copper-containing metal layer predominantly composed of copper in the foregoing embodiments, the present invention is also applicable to the case where the fuse links are constituted of a different material, provided that the electromigration provokes the reconnection.

Figure 8:
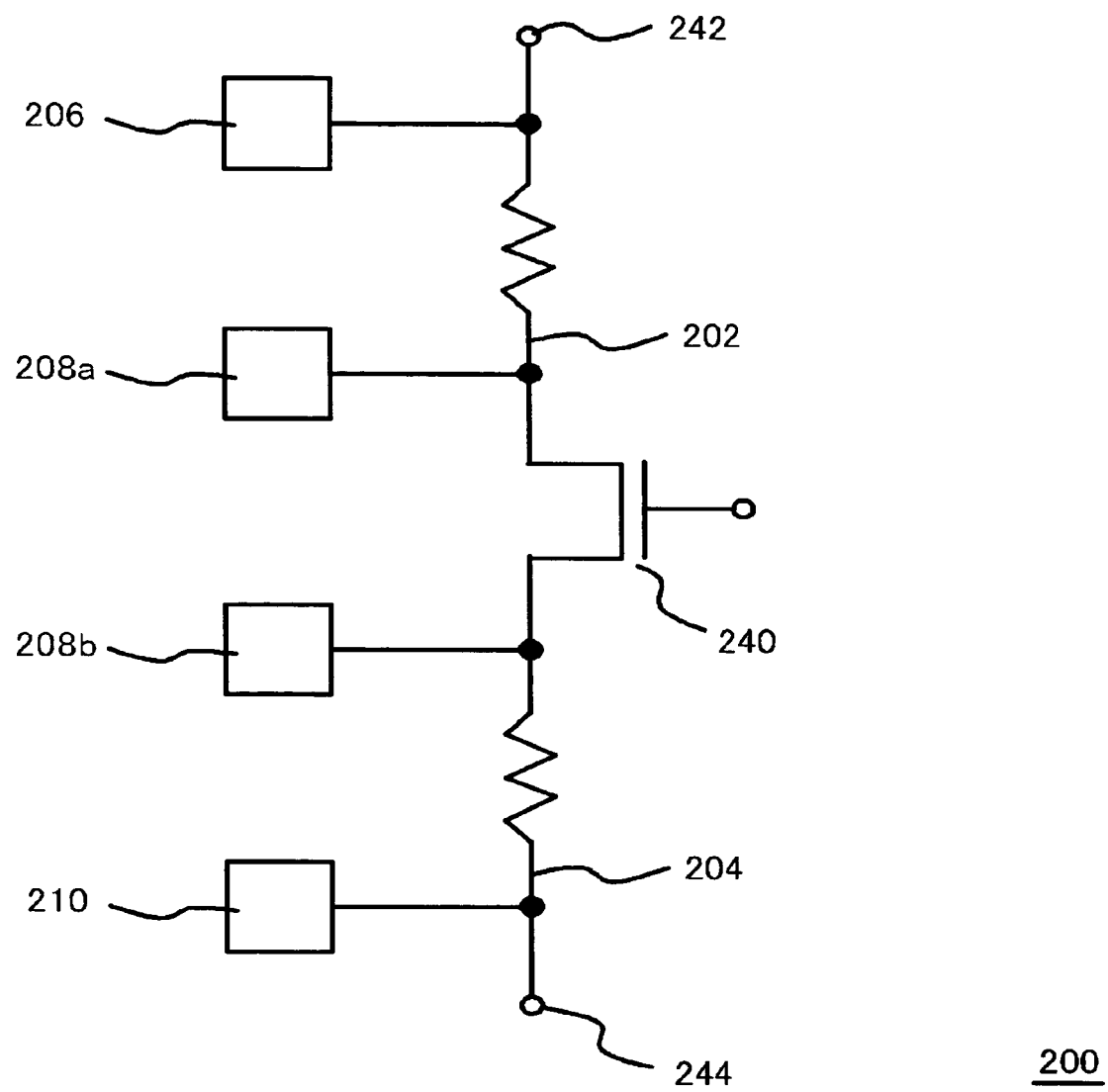
FIG. 8 is a circuit diagram of another electrical fuse.

Also, referring to FIG. 8, the first fuse link 202 and the second fuse link 204 may be connected in series via a switch element such as a transistor 240, in the electrical fuse 200. In FIG. 8, the first fuse link 202 is connected to either of the source/drain of the transistor 240, and the second fuse link 204 is connected to the other of the source/drain of the transistor 240. The first fuse link 202 is provided with the first terminal 206 and the fourth terminal 208a at the respective ends thereof. The second fuse link 204 is provided with the fifth terminal 208b and the third terminal 210 at the respective ends thereof. The transistor 240 is located between the fourth terminal 208a and the fifth terminal 208b.

In the electrical fuse 200 thus configured, the transistor 240 is turned off when disconnecting the first fuse link 202 and the second fuse link 204. Under such state, when a predetermined voltage is applied between the first terminal 206 and the fourth terminal 208a, and between the fifth terminal 208b and the third terminal 210 respectively, the current is supplied to the first fuse link 202 and to the second fuse link 204, thereby disconnecting those fuse links. For detecting whether the electrical fuse 200 is disconnected, the transistor 240 is turned on, such that a signal input through an input terminal 242 is output through an output terminal 244. Such arrangement enables surely disconnecting the first fuse link 202 or the second fuse link 204 in the disconnection process, and detecting that the electrical fuse 200 is disconnected if one of the fuse links is disconnected in the detection process, thus significantly reducing the reconnection probability of the electrical fuse 200.

Figure 9:
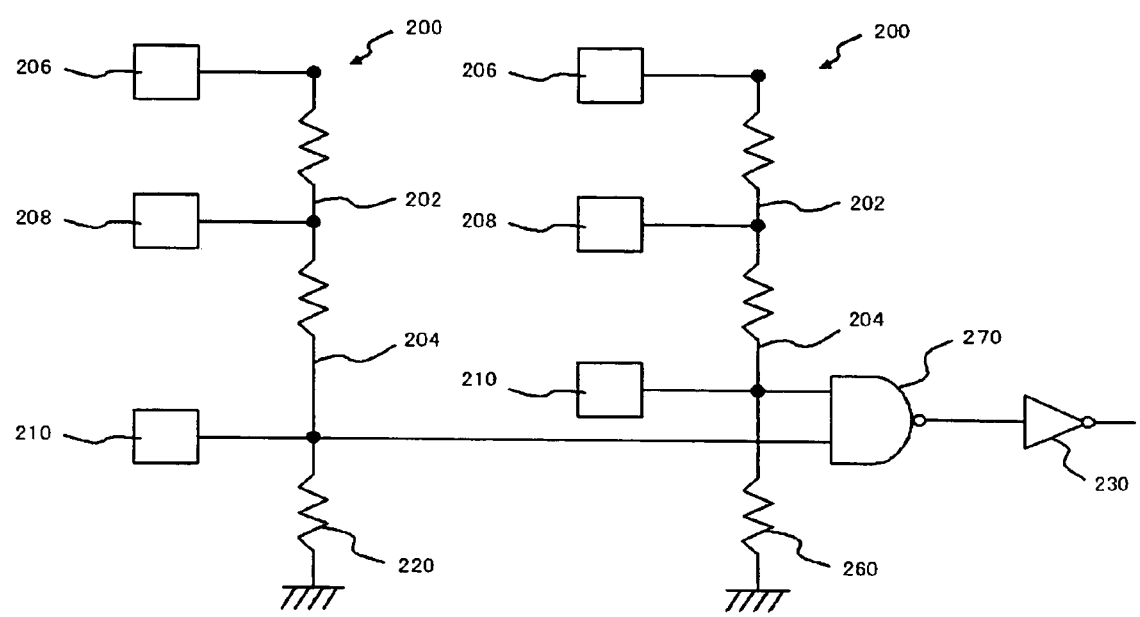
FIG. 9 is a circuit diagram of another circuit for controlling a potential level in which the electrical fuse shown in FIG. 1 is introduced.

FIG. 9 is a circuit diagram of another circuit for controlling a potential level in which the electrical fuse shown in FIG. 1 is introduced.

In FIG. 9, whether the electrical fuse is disconnected is decided based on a combination of two electrical fuses 200. Specifically, an output from the two electrical fuses 200 is input to a NAND circuit 270, and connected to the inverter 230 via the NAND circuit 270. A respective end of the two electrical fuses 200 on the side of the second fuse link 204 is connected to the resistance 220 and the resistance 260.

For example, to put the electrical fuse in a disconnected state under the combination of the two electrical fuses 200, the first fuse link 202 and the second fuse link 204 in the respective electrical fuses 200 are disconnected. Then when VCC is applied to the respective first terminal 206 of the electrical fuses 200, a low level signal is input to the NAND circuit 270 if at least one of the two electrical fuses 200 is disconnected. When at least one low level signal is input to the NAND circuit 270, the NAND circuit 270 outputs a low level signal. In this example, the reconnection probability of the respective electrical fuses 200 is already significantly reduced, and besides the connection state is decided based on the combination of the plurality of electrical fuses 200. Therefore, the disconnection of the fuse link can be further ensured.

The present invention is also applicable to an antifuse. The antifuse has a reverse function to the electrical fuse, and becomes electrically connected when a voltage is applied thereto. The antifuse may be constituted of two pieces of conductive materials with an insulating material interposed therebetween. Under such structure, applying a predetermined voltage between the two conductive materials can provoke a dielectric breakdown of the insulating material, thus electrically connecting the two conductive materials. Here, the conductive material may be constituted of a copper-containing metal layer predominantly composed of copper. The antifuse may also incur redisconnection after being once connected, for example by migration of the material constituting the conductive material.

Figure 10:
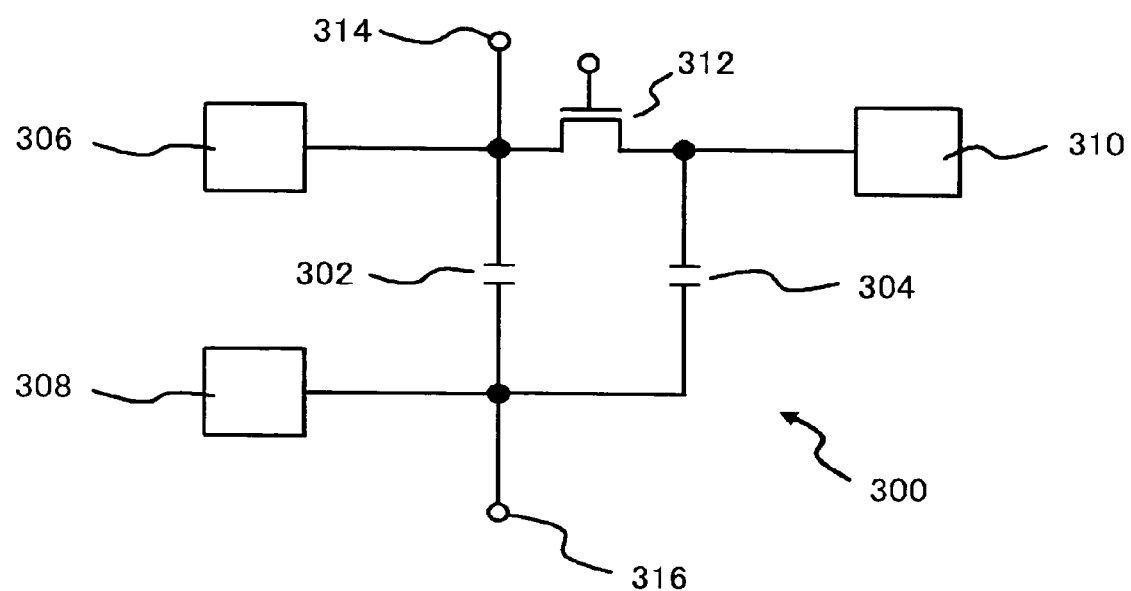
FIG. 10 is a circuit diagram of an antifuse according to the present invention.

FIG. 10 is a circuit diagram of an antifuse 300 according to the present invention.

The antifuse 300 includes a first terminal 306, a second terminal 308, a third terminal 310, a first link portion 302 to be connected by a voltage applied between the first terminal 306 and the second terminal 308, and a second link portion 304 to be connected by a voltage applied between the third terminal 310 and the second terminal 308. The antifuse 300 may also be provided on a semiconductor substrate (not shown) thus to be included in a semiconductor device, as well as the electrical fuse 200.

In FIG. 10, the first link portion 302 and the second link portion 304 are configured so as to independently receive a voltage, and to be connected in parallel. The two link portions included in the antifuse 300 may be arranged such that one of the link portions can be connected irrespective of whether the other is connected. For example, the antifuse 300 may be configured such that the two link portions are not electrically connected or are connected in series when connecting the respective link portions, and that the two link portions are connected in parallel when detecting the connection. In this example, a switch element such as a transistor 312 is provided between the first link portion 302 and the second link portion 304. An end of the first link portion 302 is connected to one of the source/drain of the transistor 312, and an end of the second link portion 304 is connected to the other of the source/drain of the transistor 312.

Although not shown, the semiconductor device may include a plurality of antifuses 300. Firstly, one of the antifuses 300 to be connected is selected. In the antifuse 300 selected for connection, the first link portion 302 and the second link portion 304 are respectively electrically connected. To connect the first link portion 302 in the antifuse 300 to be connected, the transistor 312 is turned off, and a predetermined high potential (VCC) is applied for example to the first terminal 306, and the second terminal 308 is grounded. At this moment, the third terminal 310 is also grounded so as to keep the second link portion 304 from receiving a voltage. Thus, the insulating material of the first link portion 302 incurs the dielectric breakdown, thereby electrically connecting the first link portion 302.

Likewise, to connect the second link portion 304, the transistor 312 is turned off, and a predetermined high potential (VCC) is applied for example to the third terminal 310, and the second terminal 308 is grounded. At this moment, the first terminal 306 is also grounded so as to keep the first link portion 302 from receiving a voltage. Thus, the insulating material of the second link portion 304 incurs the dielectric breakdown, thereby electrically connecting the second link portion 304.

Thereafter, the connection state of the antifuse 300 is detected. When detecting the antifuse 300, the transistor 312 is turned on, to achieve conduction between an end of the first link portion 302 and an end of the second link portion 304. Accordingly, the first link portion 302 and the second link portion 304 are connected in parallel. Under such state, a signal input through the input terminal 314 is output through the output terminal 316. Such arrangement enables ensuring the connection of the first link portion 302 and the second link portion 304 in the connection process, and detecting, in the detecting process, that the antifuse 300 is connected provided that at least one of the link portions is connected, thereby significantly reducing the redisconnection probability of the antifuse 300.

Figure 16:
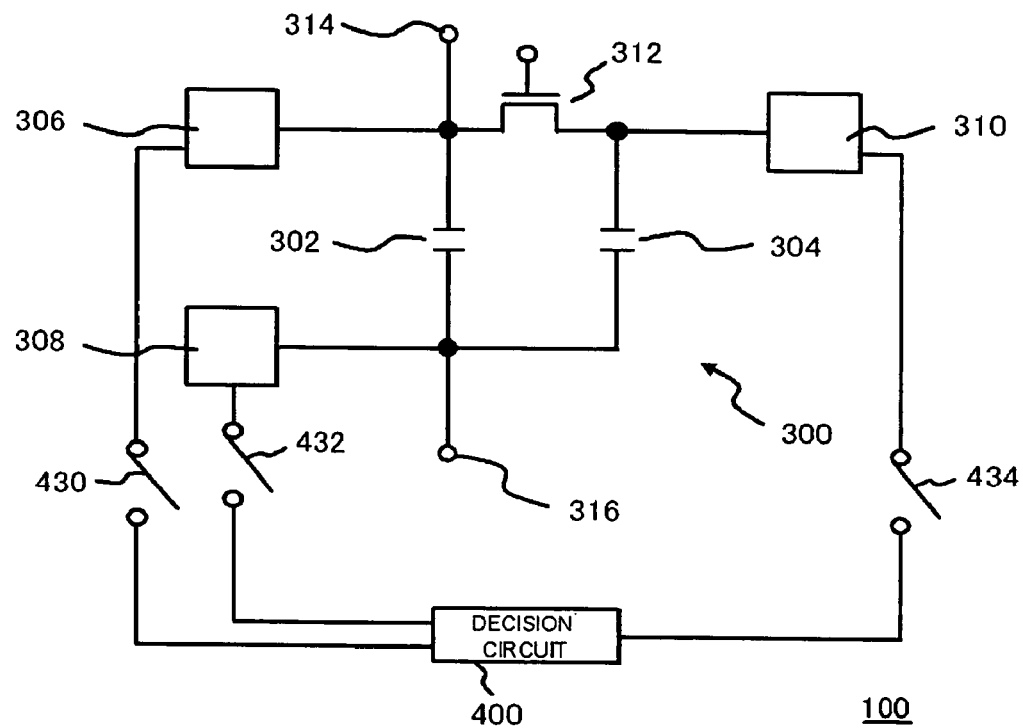
FIG. 16 is a circuit diagram of a semiconductor device including a circuit for connecting an antifuse.

FIG. 16 is a circuit diagram of a semiconductor device including a circuit for disconnecting the antifuse 300.

The semiconductor device 100 includes the decision circuit 400, a switch 430 provided between the first terminal 306 and the decision circuit 400, a switch 432 provided between the second terminal 308 and the decision circuit 400, and a switch 434 provided between the third terminal 310 and the decision circuit 400. The transistor 312 is provided between the first link portion 302 and the second link portion 304. Whether the first link portion 302 is connected can be detected based on a current value between the first terminal 306 and the second terminal 308 by turning on the switch 430 and the switch 432 and turning off the switch 434 with having the transistor 312 turned off. Likewise whether the second link portion 304 is connected can be detected based on a current value between the second terminal 308 and the third terminal 310, by turning on the switch 432 and the switch 434 and turning off the switch 430 with having the transistor 312 turned off. The decision circuit 400 decides whether both of the first link portion 302 and the second link portion 304 are connected right after the connection operation of the first link portion 302 and the second link portion 304. On the other hand, the decision circuit 400 decides whether at least one of the first link portion 302 and the second link portion 304 is connected during use of the electrical fuse 200.

Figure 11:
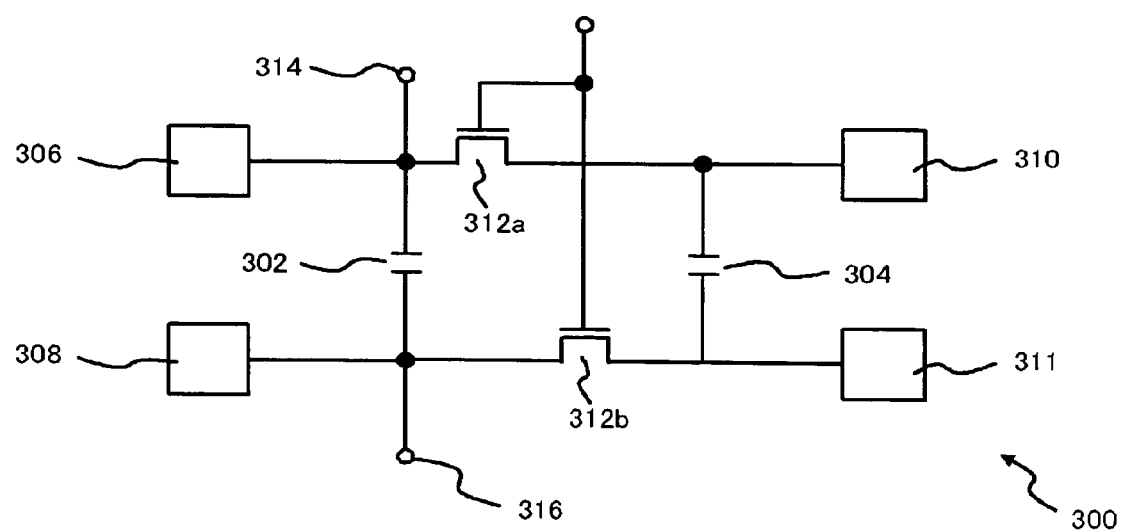
FIG. 11 a circuit diagram of another antifuse according to the present invention.
Figure 12:
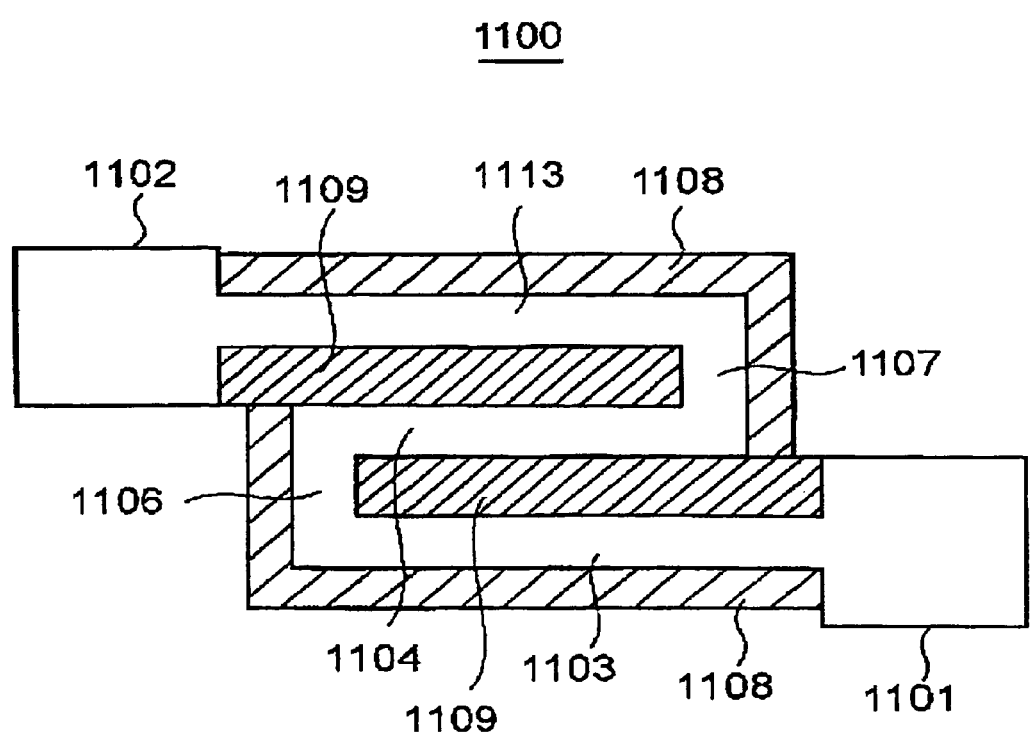
FIG. 12 is a plan view showing a conventional electrical fuse.

Alternatively, a configuration as shown in FIG. 11 may be adopted.

In FIG. 11, the first link portion 302 is provided with the first terminal 306 and the second terminal 308 at the respective ends thereof, and the second link portion 304 is provided with the third terminal 310 and the fourth terminal 311 at the respective ends thereof. Between an end of the first link portion 302 and an end of the second link portion 304, i.e. between the first terminal 306 and the third terminal 310, a first transistor 312a is provided. Between the other end of the first link portion 302 and the other end of the second link portion 304, i.e. between the second terminal 308 and the fourth terminal 311, a second transistor 312b is provided. When connecting the first link portion 302 and the second link portion 304, respectively, the first transistor 312a and the second transistor 312b may be turned off, and a predetermined voltage may be respectively applied between the first terminal 306 and the second terminal 308, and between the third terminal 310 and the fourth terminal 311, to thereby connect the first link portion 302 and the second link portion 304 generally at the same time. When detecting the antifuse 300, the first transistor 312a and the second transistor 312b may be turned on, so as to connect the first link portion 302 and the second link portion 304 in parallel.

Although the antifuse 300 includes two link portions in FIGS. 10 and 11, the antifuse 300 may include three or more link portions. In this case also, each link portion is configured so as to be independently connected, and to be connected in parallel when detecting the connection.

Meanwhile, the first fuse link 202 and the second fuse link 204 according to the present invention may be respectively configured as follows. Here, it is to be noted that the first fuse link 202 and the second fuse link 204 may be formed in various other shapes than those described hereunder, as long as they are configured to be disconnected when a current of a predetermined value is supplied thereto.

In the semiconductor device according to the present invention, the fuse link may include a first linear portion extending in a first direction, an second linear portion extending in a direction generally opposite to the first direction, and a third linear portion folded back in the first direction electrically connected to one another, and the first linear portion, the second linear portion, and the third linear portion may be disposed generally in parallel.

Under such structure, one of the first linear portion, the second linear portion, and the third linear portion can be surrounded by the remaining linear portions, thus to be kept under a relatively higher temperature. Such structure therefore facilitates efficiently disconnecting the fuse link by supplying a current.

In the semiconductor device according to the present invention, the fuse link may include a first linear portion extending in a first direction, a second linear portion extending in a direction generally opposite to the first direction, a third linear portion folded back in the first direction, a first joint linear portion connecting an end of the first linear portion and an end of the second linear portion, and a second joint linear portion connecting the other end of the second linear portion and an end of the third linear portion, electrically connected to one another.

In the semiconductor device according to the present invention, the fuse link may include a plurality of first linear portions, respectively extending in a first direction and disposed parallel to one another, and a plurality of second linear portions respectively extending in a second direction different from the first direction and disposed parallel to one another, and the plurality of first linear portions and the plurality of second linear portions may be disposed such that four sides of at least one of the first linear portions or one of the second linear portions are surrounded by others of the first linear portion or of the second linear portion. Here, the plurality of first linear portions and the plurality of second linear portions may be electrically connected to one another.

Surrounding thus the four sides of the first linear portion or the second linear portion by other linear portions allows keeping the temperature of the first linear portion or the second linear portion having its four sides surrounded at a higher level. Such configuration therefore facilitates efficiently disconnecting the first linear portion or the second linear portion having its four sides surrounded.

In the semiconductor device according to the present invention, the plurality of first linear portions and the plurality of second linear portions may be disposed such that, when a current runs from an end of the fuse link to the other end, the current runs in an opposite direction in the respective adjacent plurality of first linear portions and plurality of second linear portions.

Such configuration prevents emergence of a magnetic field that penetrates the semiconductor substrate originating from the current, when the current is supplied to the fuse link.

In the semiconductor device according to the present invention, the fuse link may include a plurality of first linear portions respectively extending in a first direction and disposed in parallel to one another, a plurality of second linear portions respectively extending in a second direction different from the first direction and disposed parallel to one another, a current inlet terminal and a current outlet terminal. The plurality of first linear portions and the plurality of second linear portions may be disposed such that, when a current runs from the current inlet terminal to the current outlet terminal, the current runs in an opposite direction in the respective adjacent plurality of first linear portions and plurality of second linear portions.

Such configuration prevents emergence of a magnetic field that penetrates the semiconductor substrate originating from the current, when the current is supplied to the fuse link.

In the semiconductor device according to the present invention, the fuse link may include a narrowed portion formed in a smaller width than the remaining portion of the fuse link.

Providing such narrowed portion facilitates efficiently disconnecting the fuse link at the narrowed portion.

In the semiconductor device according to the present invention, the fuse link may include a widened portion formed in a greater width than the remaining portion of the fuse link.

In the widened portion of the fuse link formed in a greater width, a larger amount of the material constituting the fuse link migrates because of the electromigration. Accordingly, disconnection more readily takes place at a position anterior to the widened portion in a direction opposite to the running direction of the current. Therefore, the fuse link can be easily disconnected.

In the semiconductor device according to the present invention, the fuse link may further include a current inlet terminal and a current outlet terminal, and the widened portion may be located between the current inlet terminal and the fold-back portion. In addition, the widened portion may be located in the vicinity of the fold-back portion.

At the fold-back portion, a less amount of the material constituting the fuse link is caused to migrate. Accordingly, providing the widened portion at a location between the current inlet terminal and the fold-back portion facilitates disconnecting the fuse link between the widened portion and the fold-back portion.

In the semiconductor device according to the present invention, the widened portion may be provided on the side of the current inlet terminal. According to the present invention, since the fuse link is folded back a plurality of times as already stated, the widened portion located close to the fuse link is kept under a relatively higher temperature, and is hence easy to be disconnected at a position close to the widened portion, because of the electromigration.

In the semiconductor device according to the present invention, the widened portion may be provided at a generally central portion of the fuse link. According to the present invention, since the fuse link is folded back a plurality of times as already stated, a central portion of the fuse link is kept under a relatively higher temperature, and is hence easy to be disconnected. Thus, providing the widened portion at a central portion of the fuse link facilitates efficiently disconnecting the fuse link.

According to the present invention, there is provided a semiconductor device including a semiconductor substrate, a fuse link provided on the semiconductor substrate to be disconnected by supplying a current, in which the fuse link is formed in a bent shape and includes a widened portion formed in a greater width than the remaining portion of the fuse link.

In the widened portion of the fuse link formed in a greater width, a larger amount of the material constituting the fuse link migrates because of the electromigration. Accordingly, providing the widened portion in the fuse link urges disconnection at a position anterior to the widened portion in a direction opposite to the running direction of the current. Therefore, the fuse link can be easily disconnected. Besides, a less amount of the material constituting the fuse link is caused to migrate at the bent portion. Accordingly, providing the bent portion and the widened portion in the fuse link further facilitates disconnecting the fuse link.

In the semiconductor device according to the present invention, the widened portion may be provided at a position closer to the current inlet terminal than the bent portion. The widened portion may be located in the vicinity of the bent portion.

In the semiconductor device according to the present invention, the widened portion may be provided at a generally central portion of the fuse link.

The semiconductor device according to the present invention may further include a conductor insulated from the fuse link and disposed so as to surround the fuse link.

Providing thus the conductor that covers the fuse link causes the heat generated in the fuse link when a current is supplied thereto to be reflected by the conductor and detained, thus further facilitating the disconnection of the fuse link.

In the semiconductor device according to the present invention, the conductor may include a via conductor provided at a lateral portion of the fuse link.

In the semiconductor device according to the present invention, the second fuse link may include a conductor plate provided at least on an upper side or a lower side of the fuse link.

In the semiconductor device according to the present invention, a transistor may be provided on the semiconductor substrate, so as to supply a current to the fuse link by turning on the transistor. Here, the transistor may be a MOSFET.

It is apparent that the present invention is not limited to the above embodiment, and may be modified and changed without departing from the scope and spirit of the invention.

What is claimed is:

1. A semiconductor device comprising:
a semiconductor substrate, and an electrical fuse provided on said semiconductor substrate,
wherein said electrical fuse includes:
a first fuse link,
a second fuse link coupled to said first fuse link,
a first current inlet/outlet terminal and a second current inlet/outlet terminal respectively provided at an end and the other end of said first fuse link,
a third current inlet/outlet terminal and a fourth current inlet/outlet terminal respectively provided at an end and the other end of said second fuse link, and
a decision unit which is coupled to said first current inlet/outlet terminal, said second current inlet/outlet terminal, said third current inlet/outlet terminal, and said fourth current inlet/outlet terminal,
wherein said decision unit is configured to decide whether both of said first fuse link and said second fuse link are disconnected and output a signal indicating that said electric fuse is disconnected when both of said first fuse link and said second fuse link are decided to be disconnected, and to decide whether one of said first fuse link and said second fuse link is connected and output a signal indicating that said electric fuse is connected when one of said first fuse link and said second fuse link is decided to be connected.

2. The semiconductor device according to claim 1, wherein said first fuse link and said second fuse link are respectively constituted of a copper-containing metal layer predominantly composed of copper.

3. The semiconductor device according to claim 1, wherein said first fuse link and said second fuse link are formed in a same size and same shape.

4. The semiconductor device according to claim 1, wherein said first fuse link includes a bent portion between said first current inlet/outlet terminal and said second current inlet/outlet terminal; and
said second fuse link includes a bent portion between said third current inlet/outlet terminal and said fourth current inlet/outlet terminal.

5. The semiconductor device according to claim 2, wherein said first fuse link includes a bent portion between said first current inlet/outlet terminal and said second current inlet/outlet terminal; and
said second fuse link includes a bent portion between said third current inlet/outlet terminal and said fourth current inlet/outlet terminal.

6. The semiconductor device according to claim 3, wherein said first fuse link includes a bent portion between said first current inlet/outlet terminal and said second current inlet/outlet terminal; and
said second fuse link includes a bent portion between said third current inlet/outlet terminal and said fourth current inlet/outlet terminal.

7. The semiconductor device according to claim 1, wherein said first fuse link includes a fold-back portion between said first current inlet/outlet terminal and said second current inlet/outlet terminal; and
said second fuse link includes a fold-back portion between said third current inlet/outlet terminal and said fourth current inlet/outlet terminal.

8. The semiconductor device according to claim 2, wherein said first fuse link includes a fold-back portion between said first current inlet/outlet terminal and said second current inlet/outlet terminal; and
said second fuse link includes a fold-back portion between said third current inlet/outlet terminal and said fourth current inlet/outlet terminal.

9. The semiconductor device according to claim 3, wherein said first fuse link includes a fold-back portion between said first current inlet/outlet terminal and said second current inlet/outlet terminal; and said second fuse link includes a fold-back portion between said third current inlet/outlet terminal and said fourth current inlet/outlet terminal.

10. The semiconductor device according to claim 4, further comprising:
a switch element provided between said second current inlet/outlet terminal and said third current inlet/outlet terminal, so as to electrically connect or disconnect said first fuse link and said second fuse link.

11. The semiconductor device according to claim 7, further comprising:
a switch element provided between said second current inlet/outlet terminal and said third current inlet/outlet terminal, so as to electrically connect or disconnect said first fuse link and said second fuse link.

12. The semiconductor device according to claim 1, wherein said decision unit decides that said electrical fuse is non-defective when said first fuse link and said second fuse link are both disconnected.

13. The semiconductor device according to claim 1, wherein said decision unit which is configured to further decide whether neither of said first fuse link and said second fuse link is disconnected and output a signal indicating that said electric fuse is connected when neither of said first fuse link and said second fuse link is decided to be disconnected.

14. The semiconductor device according to claim 1, further comprising a switch element provided between said second current inlet/outlet terminal and said third current inlet/outlet terminal, so as to electrically connect or disconnect said first fuse link and said second fuse link.

15. The semiconductor device according to claim 1, wherein said decision unit is configured to further decide whether one of said first fuse link and said second fuse link is disconnected and output a signal indicating that said electric fuse is disconnected after the use of said electric fuse is started.

16. The semiconductor device according to claim 1, wherein said first fuse link and said second fuse link are connected in series.

17. A semiconductor device comprising:
a semiconductor substrate, and an electrical fuse provided on said semiconductor substrate,
wherein said electrical fuse includes:
a first fuse link and a second fuse link connected in series,
a first current inlet/outlet terminal and a second current inlet/outlet terminal respectively provided at an end and the other end of said first fuse link,
a third current inlet/outlet terminal and a fourth current inlet/outlet terminal respectively provided at an end and the other end of said second fuse link, and
a decision unit which is coupled to said first current inlet/outlet terminal, said second current inlet/outlet terminal, said third current inlet/outlet terminal, and said fourth current inlet/outlet terminal,
wherein said decision unit is configured to decide whether said first fuse link and said second fuse link are both disconnected, and output a result of the decision, and
a switch element provided between said second current inlet/outlet terminal and said third current inlet/outlet terminal, so as to electrically connect or disconnect said first fuse link and said second fuse link.

* * * * *